(12) United States Patent
Hsu et al.

(10) Patent No.: US 7,298,639 B2
(45) Date of Patent: Nov. 20, 2007

(54) REPROGRAMMABLE ELECTRICAL FUSE

(75) Inventors: Louis C. Hsu, Fishkill, NY (US); Conal E. Murray, Yorktown Heights, NY (US); Chandrasekhar Narayan, San Jose, CA (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 10/908,245

(22) Filed: May 4, 2005

(65) Prior Publication Data
US 2006/0249808 A1    Nov. 9, 2006

(51) Int. Cl.
*G11C 17/00* (2006.01)
(52) U.S. Cl. .......................... 365/96; 365/94
(58) Field of Classification Search ............... 365/94 X, 365/94, 96
See application file for complete search history.

(56) References Cited

U.S. PATENT DOCUMENTS 5,536,968 A * 7/1996 Crafts et al. ............... 257/529
6,548,358 B2    4/2003 Arndt et al.
7,075,127 B2 * 7/2006 Kothandaraman et al. .. 257/209

OTHER PUBLICATIONS

Jiang Tao et al., "An Electromigration Failure Model for Interconnects Under Pulsed and Bidirectional Current Stressing," IEEE Transactions on Electron Devices, vol. 41, No. 4, Apr. 1994, pp. 539-545.

E. Castano, et al., "In situ observations of dc and ac electromigration in passivated Al lines", Appl. Phys. Lett. 59 (1), 129 Jul. 1991, pp. 129-131.

* cited by examiner

*Primary Examiner*—VanThu Nguyen
(74) *Attorney, Agent, or Firm*—Lisa U. Jaklitsch; Hoffman, Warnick & D'Alessandro LLC

(57) ABSTRACT

A electrically blowable fuse is programmed using an electromigration effect and is reprogrammed using a reverse electro-migration effect. The state (i.e., "opened" or "closed") of the electrically blowable fuse is determined by a sensing system which compares a resistance of the electrically blowable fuse to a reference resistance.

17 Claims, 15 Drawing Sheets

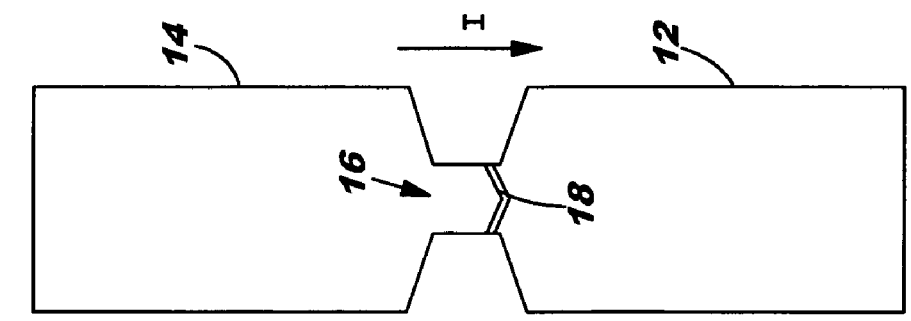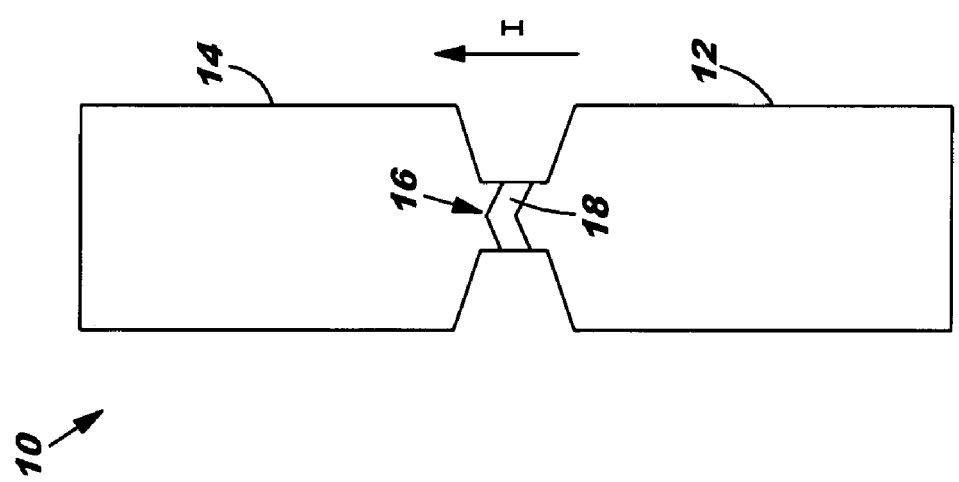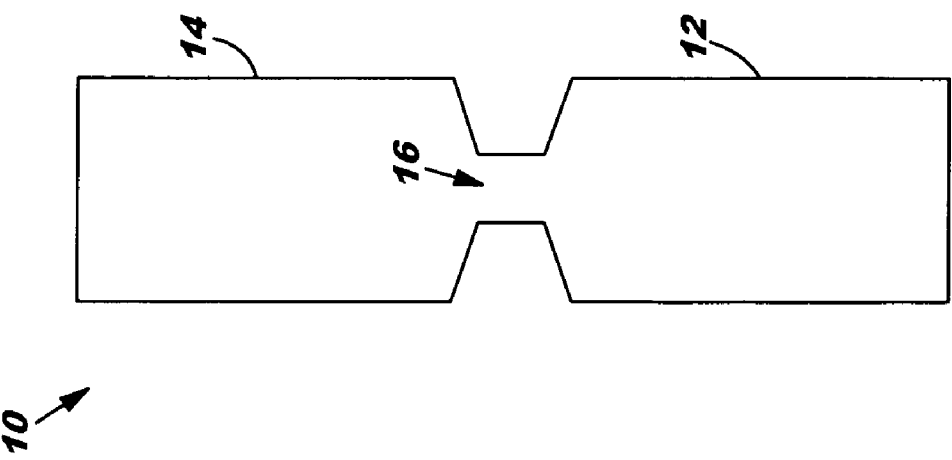

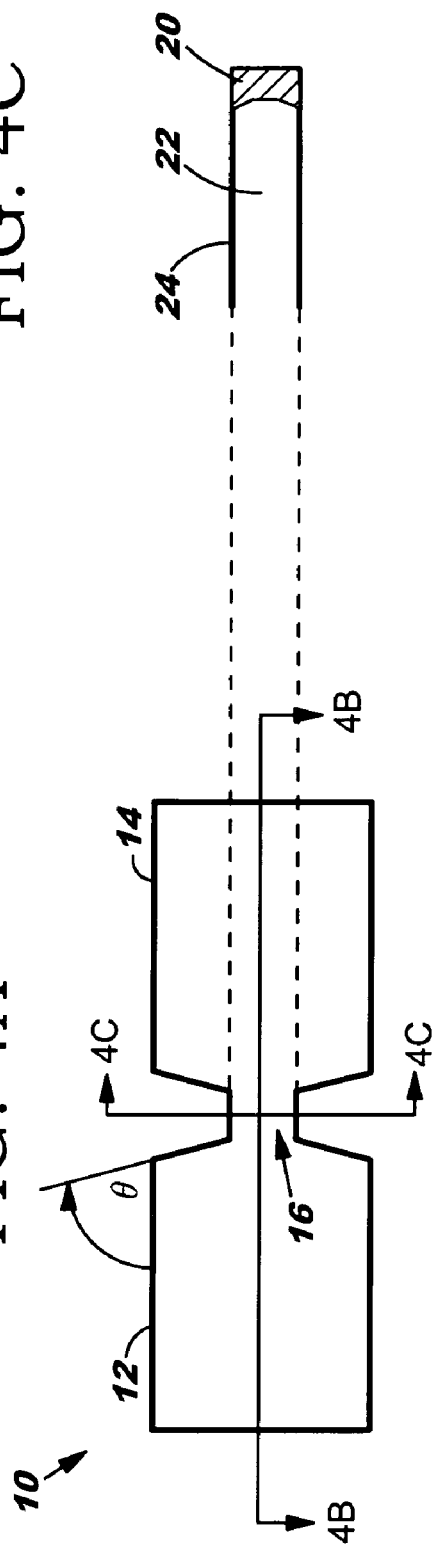
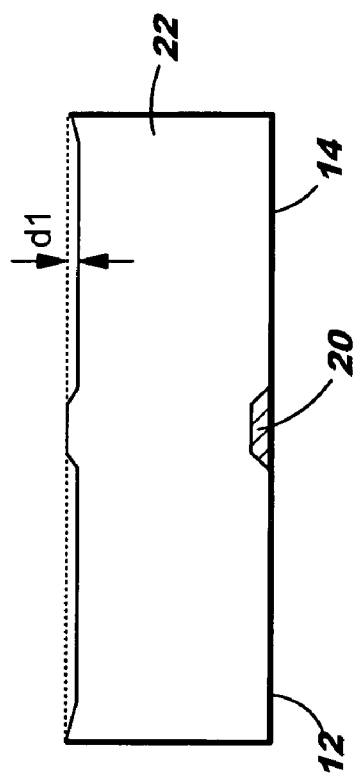

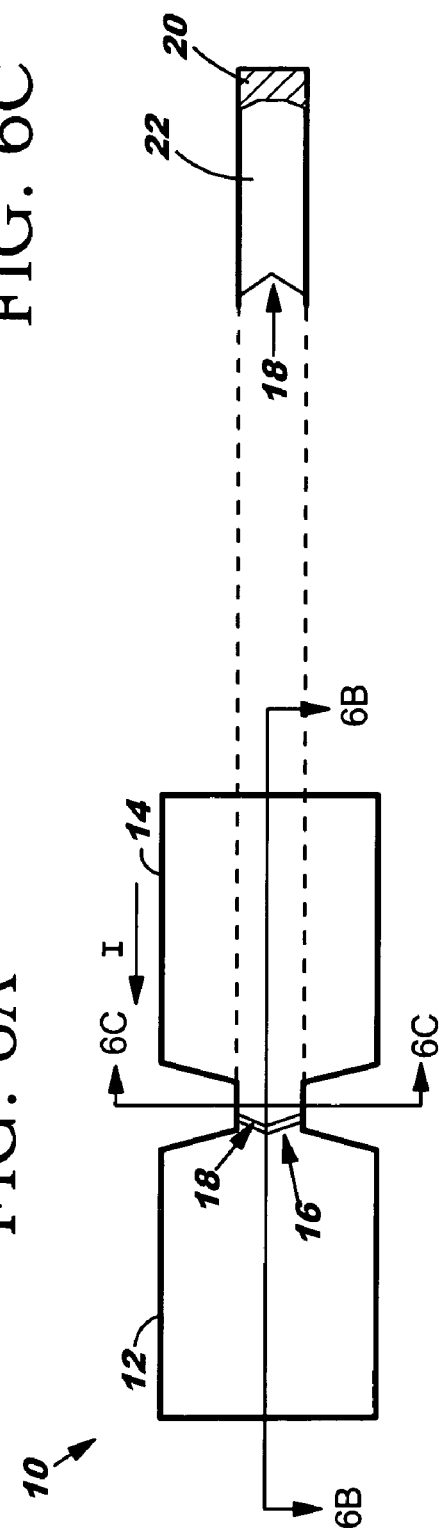
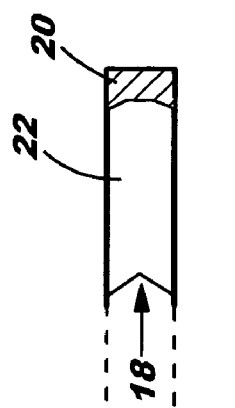
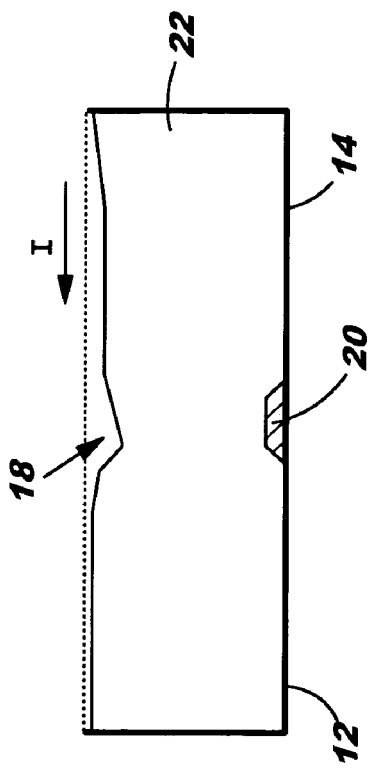

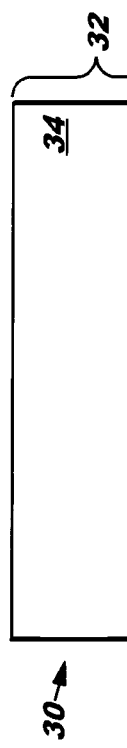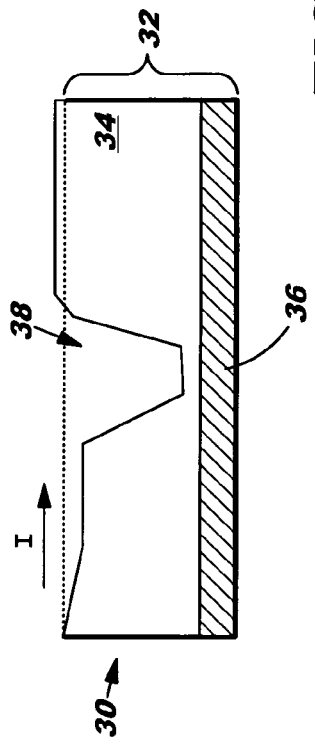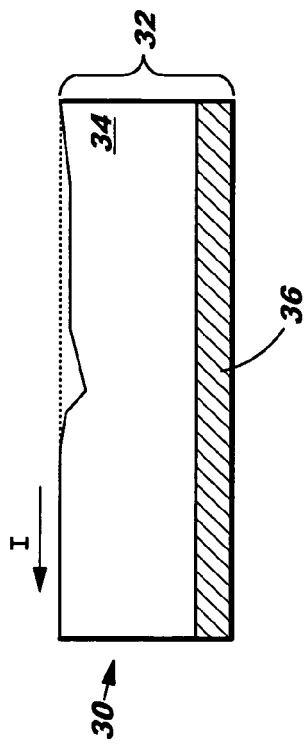

Predicted void growth and shrinkage
($J_0 = 70$ mA/$\mu$m$^2$ through 0.5 $\mu$m wide line)

Predicted void growth and shrinkage
($J_0 = 70$ mA/$\mu$m² through 0.5 $\mu$m wide line)

Predicted void growth and shrinkage
($J_0 = 70$ mA/$\mu$m$^2$ through 0.5 $\mu$m wide line)

REPROGRAMMABLE ELECTRICAL FUSE

BACKGROUND OF THE INVENTION

1. Field of the Invention

The present invention generally relates to fuses included within semiconductor structures. More particularly, the present invention provides an electrical fuse that can be reprogrammed using a reverse electro-migration effect.

2. Related Art

As is known in the art, many modern semiconductor integrated circuits include fuses to protect sensitive parts during the manufacturing process, and for the activation of redundant circuits, such as redundant memory cells in the case of Dynamic Random Access Memories (DRAMs). There are typically two types of fuses, a laser-blowable fuse, and an electrically (e.g., current) blowable-fuse. Electrically blowable fuses provide an advantage over laser-blowable fuses in terms of size.

With laser blowable fuses, the fuses are typically formed at or near the surface of the integrated circuit. A laser beam striking the fuse material renders the fuse non-conductive, thereby inhibiting current from flowing through the fuse. Although laser blowable fuses are relatively simple to fabricate, there are disadvantages associated with them. For example, laser blowable fuses tend to be surface oriented, which places a limitation on the design of the integrated circuit. Further, laser blowable fuses tend to occupy a large amount of space on the surface of an integrated circuit, since adjacent fuses or devices must not be placed too close to the fuse or risk being inadvertently damaged by the laser beam during the fuse blowing operation.

Electrically blowable fuses, on the other hand, do not have to be placed at or near the surface of the integrated circuit. Accordingly, they give designers greater latitude in fuse placement. In general, electrically blowable fuses tend to be smaller than laser blowable fuses, which render them highly suitable for use in modern high density integrated circuits. Further, electrically blowable fuses have a high programming speed compared to conventional laser blowable fuses.

Various means have been used in the past to blow electrically blowable fuses. One recently used technique for opening the connection at the fuse employs the electro-migration effect, which has long been identified as a major metal failure mechanism. Electro-migration is the process whereby the ions of a metal conductor move in response to the passage of a high density current flow though the conductor. Such motion can lead to the formation of "voids" in the conductor, which can grow to a size where the conductor is unable to pass current. One can take advantage of the electro-migration effect to selectively open up metal connections (e.g., fuses) at desired locations within an integrated circuit.

One limitation of such electrically blowable fuses is they can be programmed only once (e.g., from a state "1" (conducting) to a state "0" (non-conducting)). In other words, once an electrically blowable fuse has been opened using the electro-migration effect it can not be closed again. Therefore, to reprogram or reconfigure an integrated circuit, redundant electrically blowable fuses and complicated supporting circuitry would be necessary.

Studies have been made regarding the healing of electro-migration related damage using a current reversal method. Evidence of such healing has been reported by E. Castano, et al, in a paper entitled "In Situ Observation of DC and AC Electro-migration in Passivated Al Lines," Applied Physics Letters, Volume 59, Issue 1, Jul. 1, 1991, pp. 129-131. In this paper, it was shown that void size could be decreased by applying current stress in a reverse direction. As depicted in FIG. 1, for example, it was found that the average void size was reduced from 5.0 $\mu m^2$ (point A) to 1.5 $\mu m^2$ (point B) in less than one hour. A similar study was presented by J. Tao, et al. in a paper entitled, "An Electro-migration Failure Model for Interconnects under Pulsed and Bi-directional Current Stressing," IEEE Trans on Electron Devices, Vol. 41, No. 4, April 1994, pp. 539-545. In this paper, it was shown that the resistance of a conductor made of Al/Si could be altered back and forth during forward and reverse current stressing as shown in FIG. 2. These and other such studies, however, have not provided a solution to the "programming only" nature of electrically blowable fuses that are programmed using the phenomenon of electro-migration.

SUMMARY OF THE INVENTION

The present invention provides an electrical fuse that can be reprogrammed using a reverse electro-migration effect. Electro-migration is used to open a connection in the electrical fuse, while reverse electro-migration is used to subsequently close the opened connection. A programming/reprogramming circuit is provided to enable the use of such a reprogrammable electrical fuse.

A first aspect of the present invention is directed to a method, comprising: programming an electrically blowable fuse using an electro-migration effect; and reprogramming the electrically blowable fuse using a reverse electro-migration effect.

A second aspect of the present invention is directed to a fuse system, comprising: an electrically blowable fuse; means for programming the electrically blowable fuse using an electro-migration effect; and means for reprogramming the electrically blowable fuse using a reverse electro-migration effect.

A third aspect of the present invention is directed to an integrated circuit comprising: an electrically blowable fuse; and means for programming and reprogramming the electrically blowable fuse using an electro-migration effect and a reverse electro-migration effect, respectively.

A fourth aspect of the present invention is directed to a method, comprising: reprogramming an electrically blowable fuse using a reverse electro-migration effect.

BRIEF DESCRIPTION OF THE DRAWINGS

These and other features of this invention will be more readily understood from the following detailed description of the various aspects of the invention taken in conjunction with the accompanying drawings in which:

FIGS. 3A-3C, 4A-4C, 5A-5C, and 6A-6C illustrate the operation of a reprogrammable electrical fuse in accordance with an embodiment of the present invention.

FIGS. 7A-7C illustrate the operation of a reprogrammable electrical fuse in accordance with another embodiment of the present invention.

Figure 1:
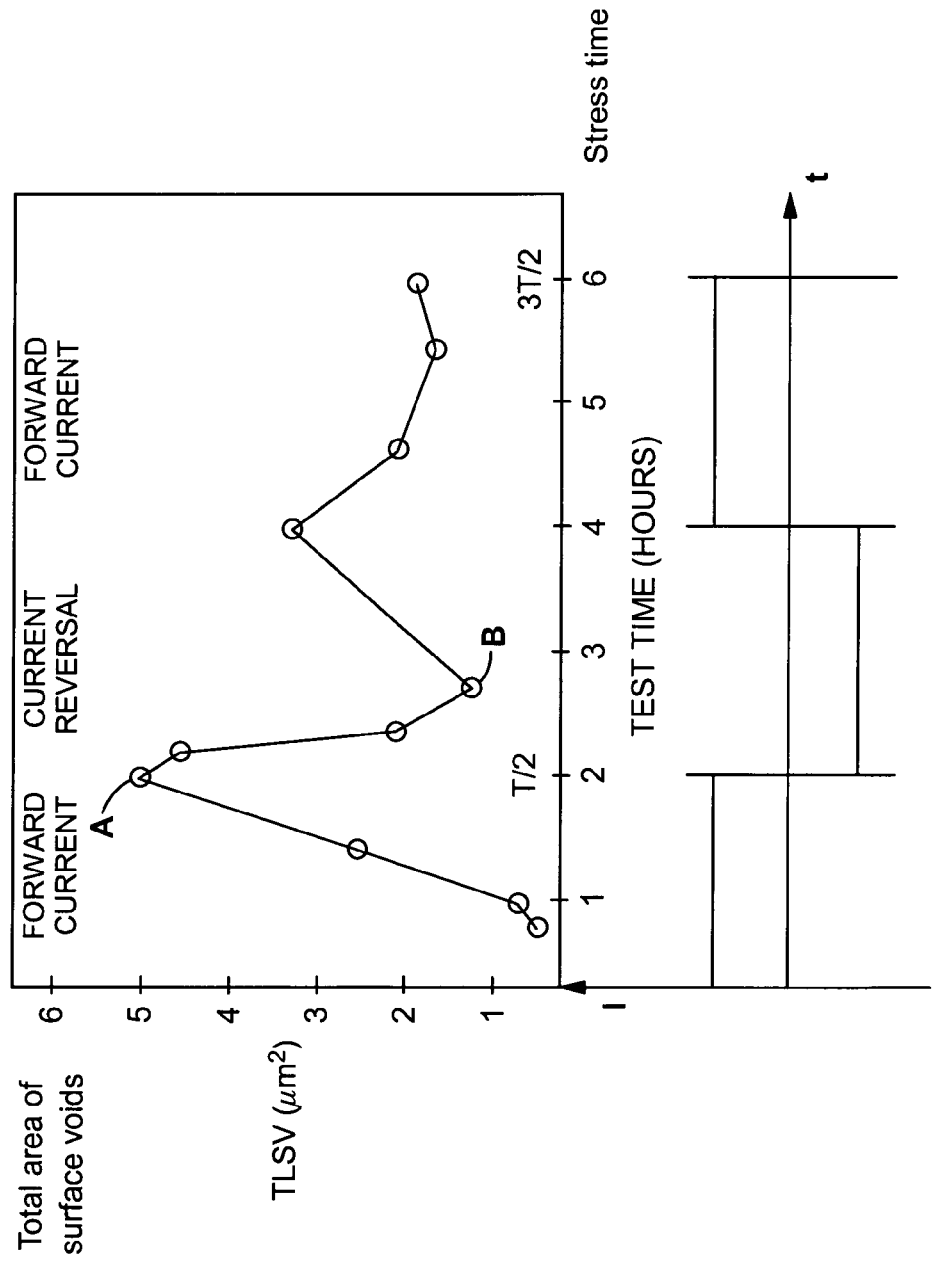
FIGS. 1-2 depict the healing of electro-migration related damage using a current reversal method.
Figure 2:
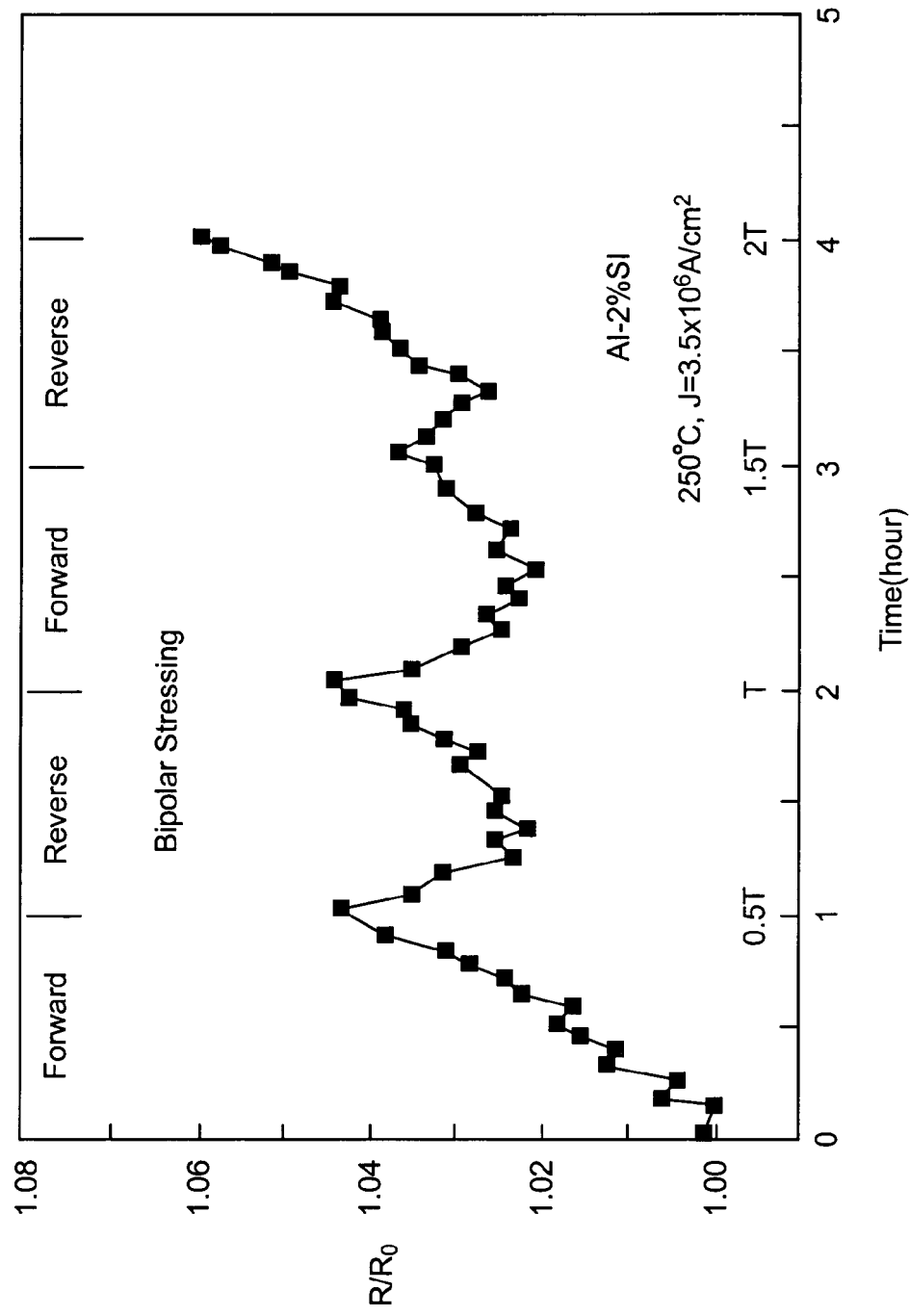

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

The general operation of a reprogrammable electrical fuse 10, hereafter referred to as an "e-fuse 10" in accordance with an embodiment of the present invention is depicted in FIGS. 3A-3C. In this example, the e-fuse 10 has a "dog-bone" shape to facilitate programming and reprogramming operations. As depicted in FIG. 3A, the e-fuse 10 includes a first conductive body region 12, a second conductive body region 14, and a conductive neck region 16 extending between the first and second body regions 12, 14. During programming, as shown in FIG. 3B, a void 18 forms in the neck region 16 of the e-fuse 10 in response to the application of a current 1. This occurs because of the so-called "crowding effect," which is caused by the flow of electrons from a larger cross-sectional area (e.g., body region 12) into a smaller cross-sectional area (e.g., neck region 16). This leads to a large temperature gradient, which expedites the electromagnetic effect. The formation of the void 18 causes the resistance of the e-fuse 10 to increase significantly. It should be noted that the neck region 16 must remain conductive to allow a reverse current flow required for reprogramming of the e-fuse 10.

During reprogramming, as shown in FIG. 3C, the void 18 is refilled and pushed toward the larger cross-sectional area of the body region 12 in response to the application of an oppositely directed current I, thereby restoring the resistance of the e-fuse 10. This occurs because of a so-called current "de-crowding effect." If too much current stress is applied in the reverse direction, however, the void 18 may start to increase in size again at a different location. To this extent, to make the e-fuse 10 of the present invention reprogrammable, one must:

(1) Provide a structure that allows metal to migrate in a controllable manner in both forward and reverse current flow directions;

(2) Create a large resistive ratio change; and (3) Provide a reference resistance $R_{ref}$ to determine the state of the e-fuse 10. Prior to programming (and after reprogramming) the reference resistance $R_{ref}$ is higher than the resistance of the e-fuse 10. After programming, the reference resistance $R_{ref}$ is much lower than the resistance of the e-fuse 10.

Different voltages and currents may be applied to the e-fuse 10 to perform programming and reprogramming. During programming, the resistance of the e-fuse 10 will rise higher than the reference resistance $R_{ref}$, while during reprogramming the resistance of the e-fuse 10 will drop lower than the reference resistance $R_{ref}$.

The present invention provides a sensor circuit (described in greater detail below) to sense the change of resistance of the e-fuse 10 and latch the results into a corresponding register. One reference resistance can be shared by a bank of e-fuses 10 to save power and area overhead. In this case, sensing can be done in sequential manner, for example, during a power-on sequence to read the bank of e-fuses 10, and the results stored in one or more registers. The stored results can be used to provide information regarding programming state. The registers can comprise a small cache memory like that of DRAMs, or local registers.

As shown in FIG. 4A, an illustrative e-fuse 10 has a "dog-bone" shape with a taper angle θ of about 45 to 75 degrees and a neck region 16 with a width/body ratio from about 1/10 to 1/3, depending on the width of the body regions 12, 14. As will be presented in greater detail below, the taper facilitates the programming/reprogramming of the e-fuse 10.

Cross-sectional views of the e-fuse 10 taken along line 4B-4B and 4C-4C are illustrated in FIGS. 4B and 4C, respectively. A uniform thickness of a barrier film formed of a material such as titanium (Ti), tantalum (Ta), tungsten (W), titanium nitride (TiN), or a combination thereof is deposited in a conventional manner at the bottom of the e-fuse 10 to form a barrier layer 20. Due to the reduced surface area within the neck region 16, the deposited barrier film will be much thicker in the neck region 16 as compared to the body regions 12, 14. The thicker barrier layer 20 in the neck region 18 shrinks the cross-section of the neck region 16 in the third (i.e., Z) dimension. This increases the current density inside the neck region 16, thereby enhancing the electro-migration effect in the e-fuse 10.

A metal material 22, such as aluminum (Al), copper (Cu), aluminum-copper (Al/Cu) alloy, or other suitable metal material susceptible to electro-migration, is then deposited and planarized (e.g., using chemical-mechanical-polishing (CMP)). A depletion region d1 is formed at the surface of the body regions 12, 14. A dielectric material (not shown) is deposited to cap the top surface of the e-fuse 10.

The sidewall 24 of the e-fuse 10 comprises a barrier liner formed of a material such as Ti, Ta, W, TiN, or a combination thereof. Other conductive materials such as doped polysilicon or a silicided diffusion region can also be used. The barrier liner can be used to provide the reference resistance $R_{ref}$ described above with regard to the programming/reprogramming of the e-fuse 10. The material of the barrier liner is not sensitive to the electro-migration effect and has a resistance value higher than that of the e-fuse 10 prior to programming (and after reprogramming) and a resistance value much lower than that of the e-fuse 10 after programming. The material of the barrier liner is preferably compatible with back end of line (BEOL) metallization processes to limit processing costs.

Figure 5A:
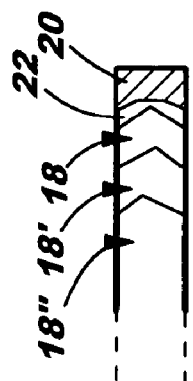
Figure 5C:
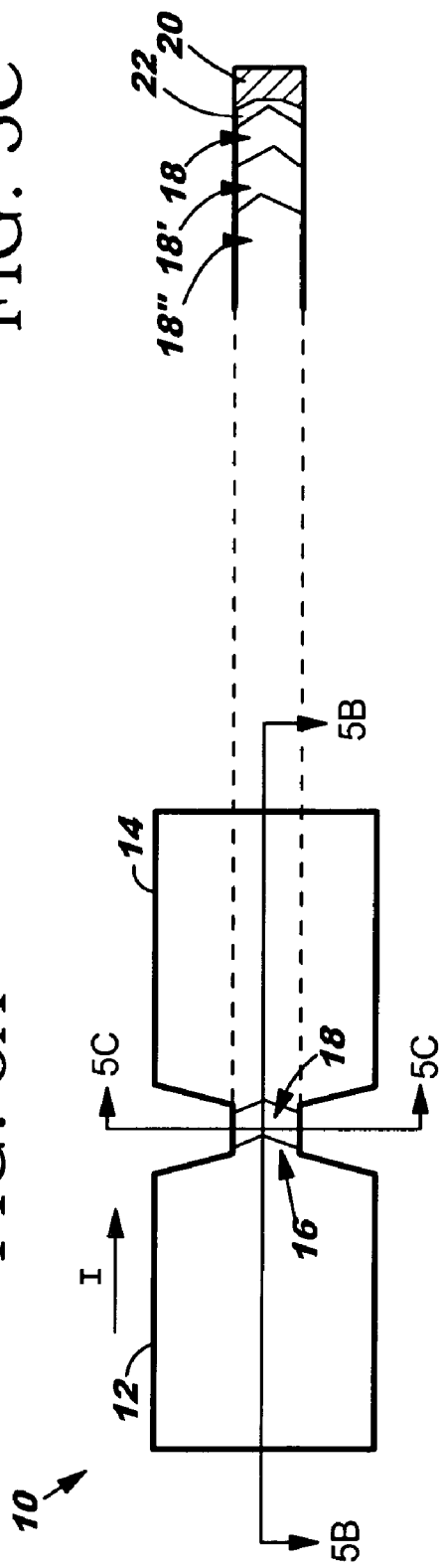
Figure 5B:
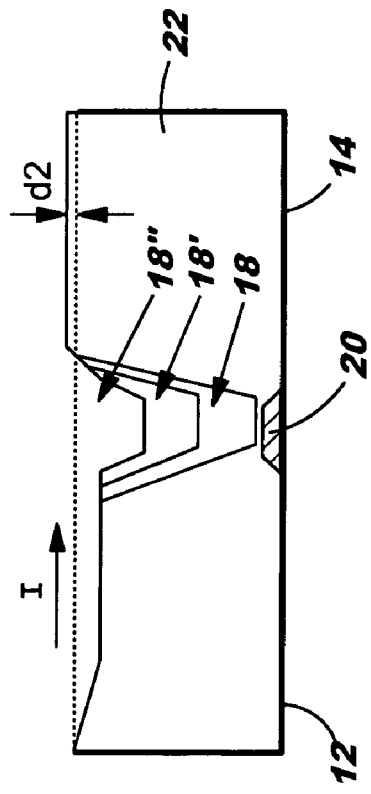

After programming, as shown in FIGS. 5A-5C, a void 18 is created in the neck region 16 of the e-fuse 10 due to the electro-migration effect. As a result, the resistance of the e-fuse 10 is drastically increased, even though the void 18 may only be located partially within the neck region 16. Programming conditions (e.g., voltage, current, temperature, etc.) are controlled so that that a desired void 18 size is formed. If the void 18 size is too small, the e-fuse 10 will be under-programmed. If the void 18 size is too large, it may not be possible to reprogram the e-fuse 10. Neither of these conditions is desirable.

As shown in FIG. 5B, during the programming of the e-fuse 10, metal migrates from the neck region 16 of the e-fuse 10 toward the body region 14 and accumulates to a depth d2. As a result, this area of the e-fuse 10 has a higher atomic density and is more stressed than before programming. The migration of the metal results in the creation of a void 18 located at least partially within the neck region 16 of the e-fuse 10. Different degrees of programming can be used to create different sized voids 18', 18", etc., with different depths, resulting in different resistance values for the programmed e-fuse 10. The resistance of the e-fuse 10 after programming is much greater than the reference resistance $R_{ref}$.

During the programming of the e-fuse 10, high-voltage and high-current are applied to the e-fuse 10 at room or high temperature (e.g., 100 to 250° C.) to "open" the e-fuse 10 in a relatively short period of time. Care must be taken, however, to ensure that at least some of the metal material 22 remains within the neck region 16 to allow a reverse current to be applied during a subsequent reprogramming of the e-fuse 10.

The reprogramming of the e-fuse 10 is illustrated in FIGS. 6A-6C. As with programming, the reprogramming of the e-fuse 10 is carried out under high-current, voltage and at room or high temperature, but in the opposite direction. As shown, excessive metal that accumulated on the body region 14 of the e-fuse 10 migrates toward the neck region 16 and at least partially fills the void 18. It may be desirable to perform in-situ monitoring during reprogramming to minimize the depth of the void 18 inside the neck region 16. The resistance of the e-fuse 10 after reprogramming is once again much lower than the reference resistance $R_{ref}$.

Another embodiment of the present invention is depicted in FIGS. 7A-7C. As shown, a reprogrammable e-fuse 30 can be formed using a conductive double-layer metal structure 32. In particular, a top metal layer 34 of the double-layer metal structure 32 can be formed using a metal material that is susceptible to electro-migration, while the bottom metal layer 36 of the double-layer metal structure 32 can be formed using a metal material that is much less susceptible (or not susceptible) to electro-migration. For example, since pure copper (Cu) is at least 2 to 4 times more susceptible to electro-migration than pure aluminum (Al) or certain alloys of Al, the top metal layer 34 can be formed of copper, while the bottom metal layer 36 can be formed of Al or an alloy thereof. In another embodiment of the present invention, the metal layers 34 and 36 can be reversed such that the metal material that is susceptible to electro-migration is located below the metal material that is much less susceptible (or not susceptible) to electro-migration. The metal material that is susceptible to electro-migration can also be sandwiched between layers of, or surrounded by, the metal material that is much less susceptible (or not susceptible) to electro-migration.

During programming of the e-fuse 30, as shown in FIG. 7B, a void 38 is formed in the top metal layer 34, which increases the resistance of the reprogrammable e-fuse 30 such that it is much greater than a reference resistance $R_{ref}$ of the e-fuse 30. During reprogramming, as shown in FIG. 7C, the void 38 is at least partially refilled and the resistance of the e-fuse 30 is reduced. Any suitable bi-layer or multi-layer metal structure can be used to form the reprogrammable e-fuse 30. The bottom metal layer 36 can also be used to provide the reference resistance $R_{ref}$ instead of using a barrier liner as detailed above.

Figure 8:
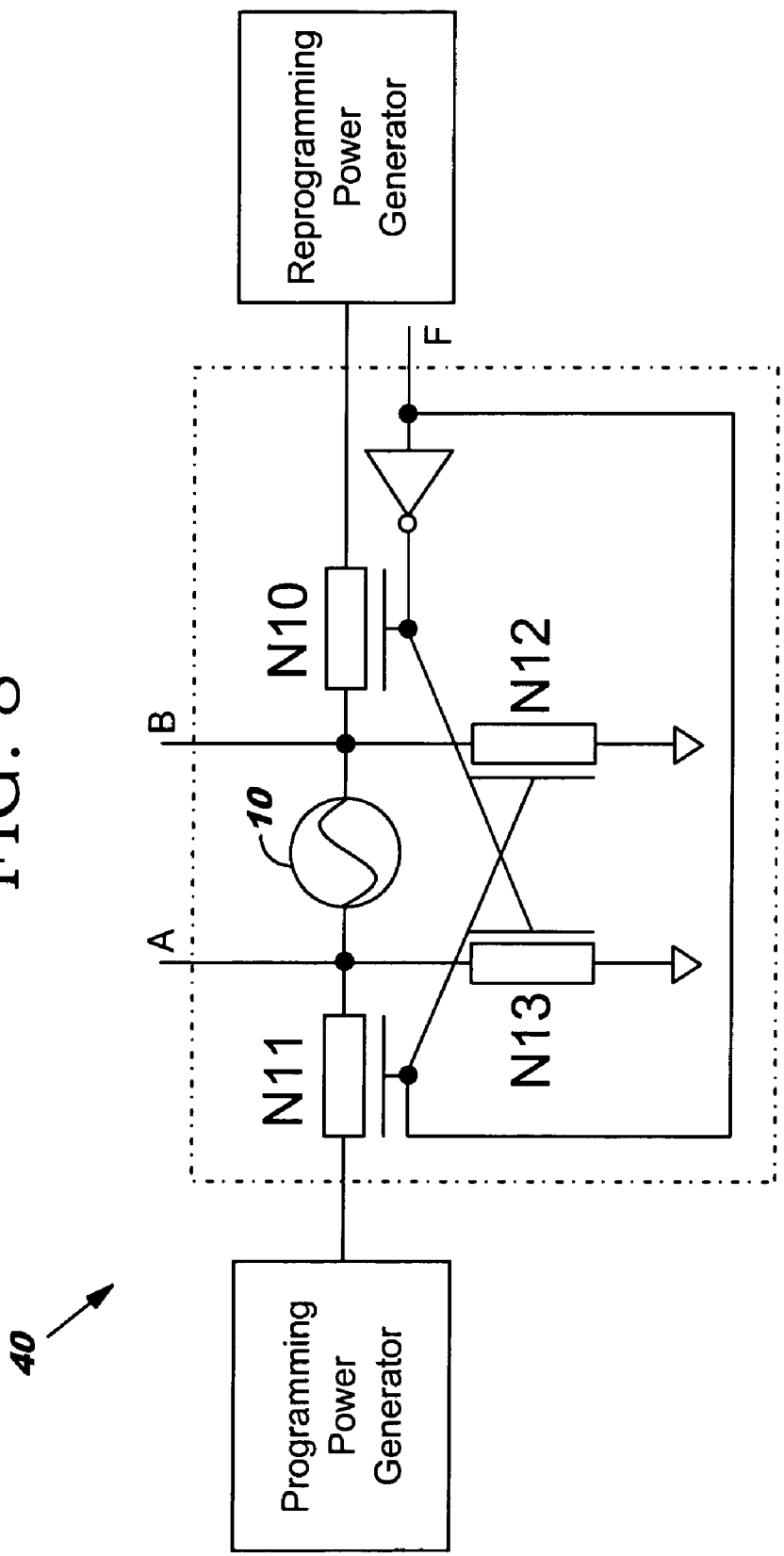
FIG. 8 depicts programming and reprogramming circuitry for a reprogrammable electrical fuse in accordance with the present invention.

Illustrative programming and reprogramming circuitry 40 for a reprogrammable e-fuse 10 in accordance with the present invention is depicted in FIG. 8. During programming, the control pin "F" is set to high, so that the two nMOS devices N11 and N12 are on, but the other two nMOS devices N10 and N13 are off. A programming current with a preset current pulse height and width is applied to the e-fuse 10 from net A to net B. Similarly, during reprogramming, the control pin "F" is set to low, so that the two nMOS devices N11 and N12 are off, but the other two nMOS devices N10 and N13 are on. A reprogramming current with another preset pulse height and width is applied to the e-fuse 10 element in the opposite direction, from net B to net A.

Figure 9:
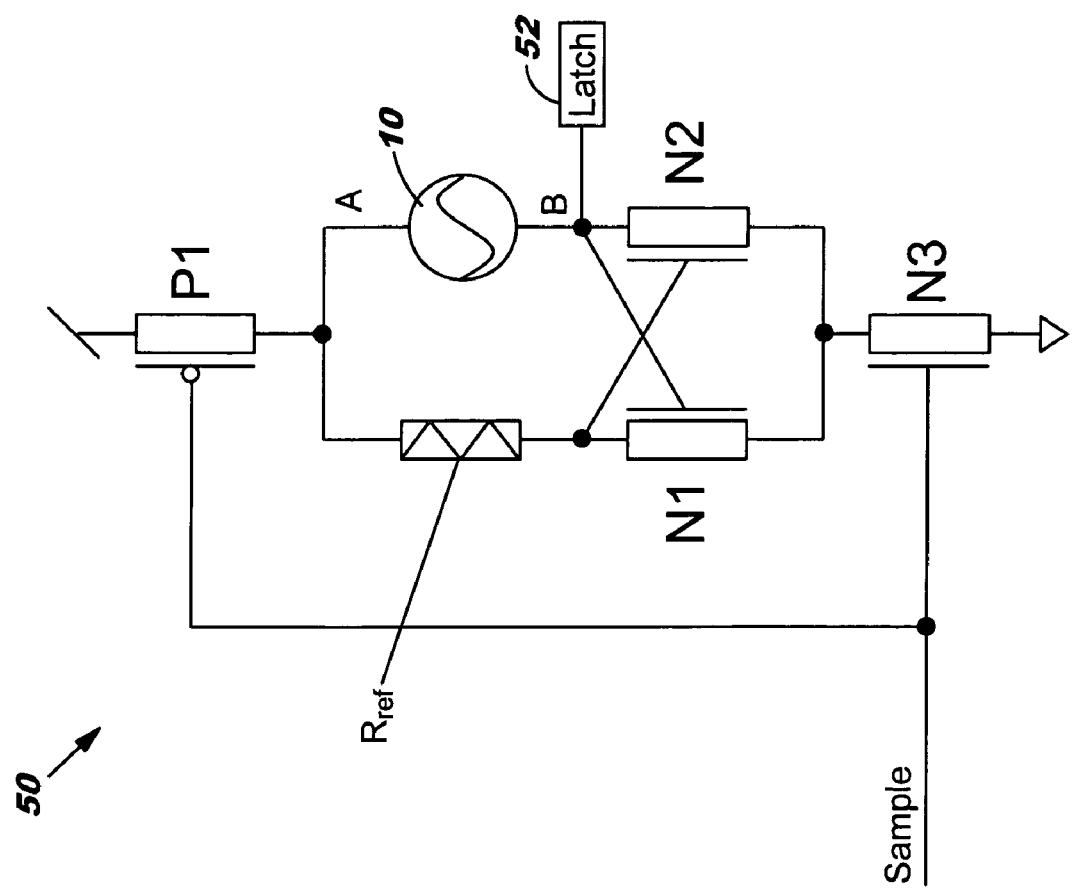
FIG. 9 depicts a sensing circuit for a reprogrammable electrical fuse in accordance with an embodiment of the present invention.

An illustrative sensing circuit 50 for a reprogrammable e-fuse 10 in accordance with an embodiment of the present invention is depicted in FIG. 9. As shown, the e-fuse 10 and a reference element $R_{ref}$ having a resistance $R_{ref}$ serve as the load for cross-coupled nMOS devices N1 and N2. A control pin "Sample" is used to activate the sensing operation. The "Sample" signal is tied to the gate of a pMOS device P1 and a nMOS device N3. After programming, most of the current will flow through N1 and cause node B to go "high," since the resistance of e-fuse 10 after programming should be substantially higher than that of the reference element $R_{ref}$. The final "high" state is latched in a latch register 52. On the other hand, after reprogramming, the resistance of the e-fuse 10 should be substantially lower than that of the reference element $R_{ref}$, and more current will flow through N2 and cause node B to go "low." The final "low" state is latched in the latch register 52. During programming and reprogramming, the "Sample" signal is off, so that both node A and B will be at float. Then, as shown in FIG. 8, either N12 (program) or N13 (reprogram) is on and a path to ground is provided to allow current to flow only through the e-fuse 10.

Figure 10:
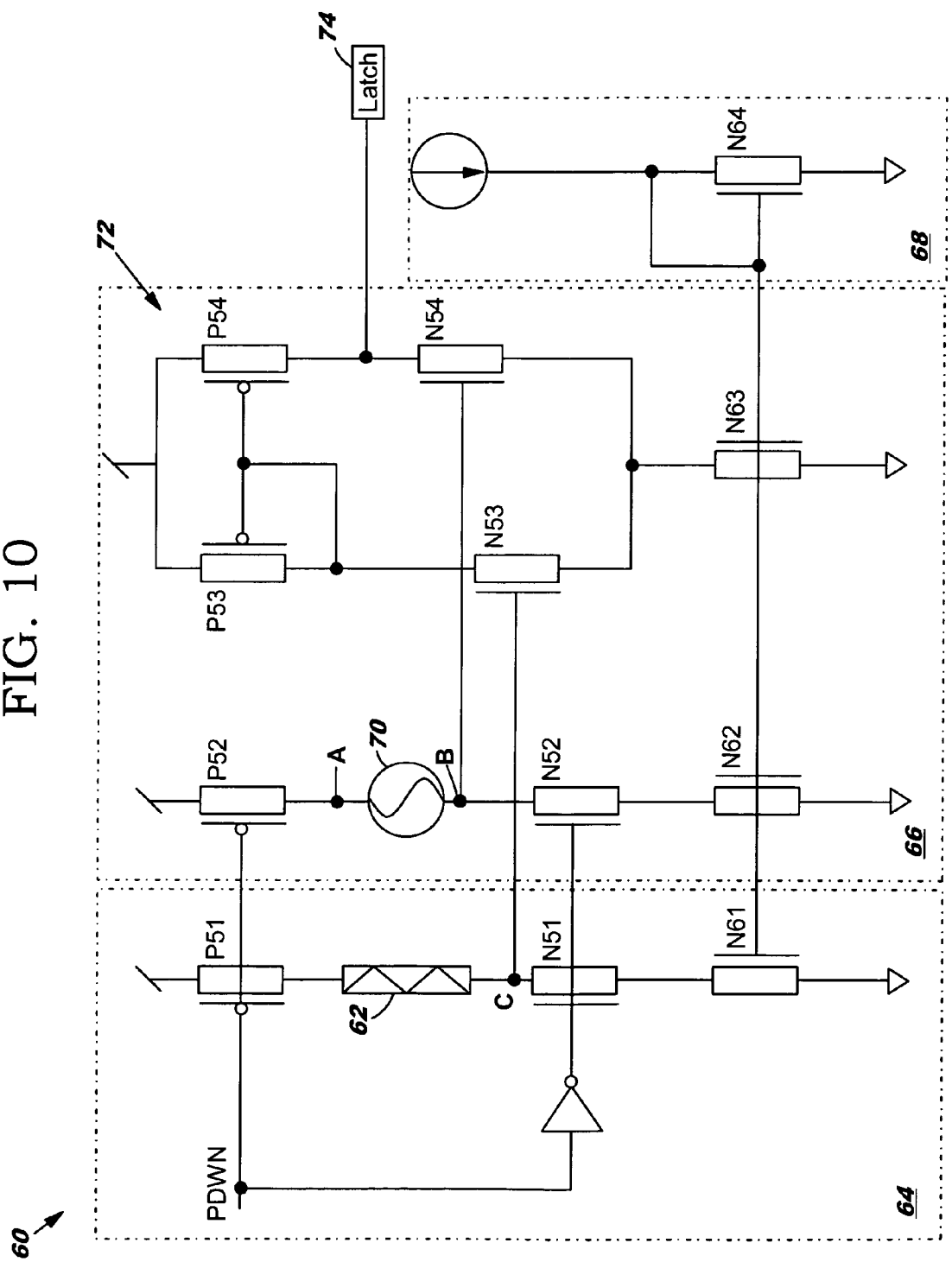
FIG. 10 depicts a sensing circuit for a reprogrammable electrical fuse in accordance with another embodiment of the present invention.

The sensing circuit 50 does not allow the reference element $R_{ref}$ to be shared among a plurality of e-fuses 10. If the size of the reference element $R_{ref}$ is relative small this approach is acceptable—a separate reference element $R_{ref}$ can be provided for each e-fuse 10. Otherwise, a sensing circuit 60 such as that shown in FIG. 10 can be used, where a single reference element 62 in a reference unit 64 is shared by a plurality of e-fuse units 66 (only one is shown). In sensing circuit 60, the reference unit 64 is used to generate a reference voltage equal to (Vdd-I*$R_{ref}$), where I is the current flow through the reference path formed by pMOS device P51 and nMOS devices N51 and N61, and $R_{ref}$ is the resistance of the reference element $R_{ref}$. The current I is mirrored by a shared current source 68.

Each e-fuse unit 66 includes an e-fuse 70. An identical amount of current I is mirrored via nMOS device N62. The output voltage at node B is Vdd-I*$R_f$, where $R_f$ is the resistance of the e-fuse 70. A comparator 72 is formed by two pMOS devices P53 and P54, two nMOS devices N52 and N54, and a tail device N63.

The output from the reference unit 64 (node C) is tied to the gate of the nMOS device N53 and the output of the e-fuse path (node B) is tied to the gate of the nMOS device N54. After programming, $R_f$>$R_{ref}$, and the voltage at node B is lower than at node C, so that output of the comparator 72 will go high and the high state will be latched by latch 74. Otherwise, after reprogramming, a low state will be latched by latch 74.

Figure 11:
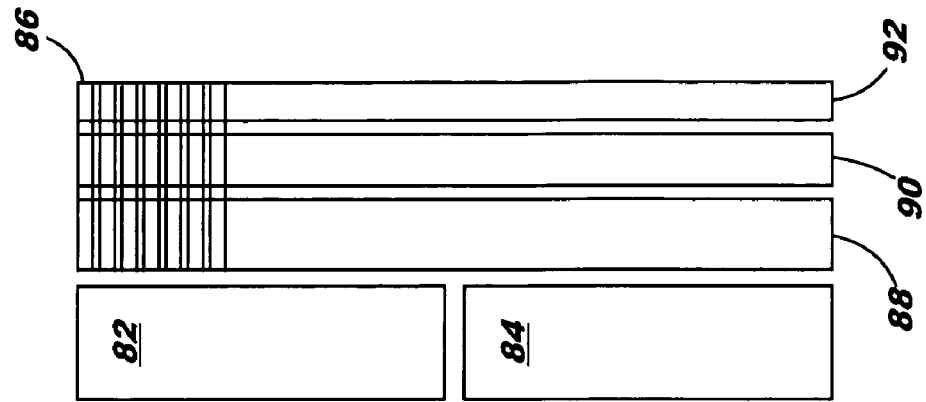
FIG. 11 depicts an illustrative physical layout of a reprogrammable electrical fuse system in accordance with an embodiment of the present invention.

An illustrative physical layout of a reprogrammable e-fuse system 80 in accordance with the present invention is depicted in FIG. 11. As shown, the physical layout of the e-fuse system 80 includes a programming power and timing generator 82, a reprogramming power and timing generator 84, and a plurality of e-fuse units 86. Each e-fuse unit 86 further includes an e-fuse module 88, a sensing element 90 and a latch 92. The programming power and timing generator 82 and reprogramming power and timing generator 84 can be merged into a single unit.

As mentioned above, the use of a tapered neck region 16 facilitates the programming/reprogramming of the e-fuse 10.

An analytical model illustrating the predicted electro-migration behavior in a tapered structure is presented below.

Figure 12:
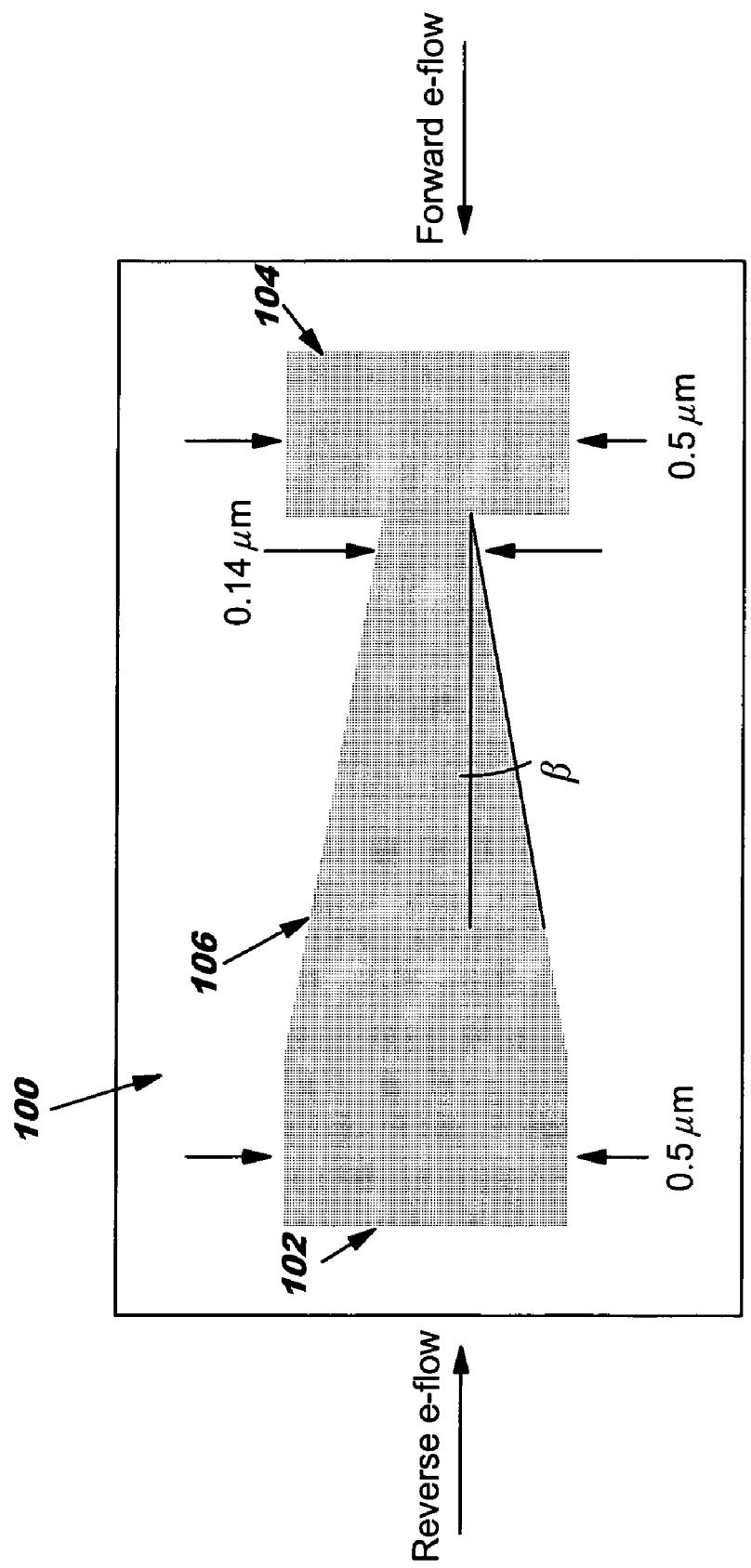
FIGS. 12-16 depict an analytical model for illustrating the predicted electro-migration behavior in a tapered structure in accordance with the concepts of the present invention.

The tapered structure 100 used in this analysis is illustrated in FIG. 12. As shown, the tapered structure 100 includes first and second body regions 102, 104, and a neck region 106 that extends between the first and second body regions 102, 104. The first and second body regions 102, 104 each have a thickness of 0.5 μm, while the thickness of the neck region 106 varies from a minimum of 0.14 μm to a maximum of 0.5 μm. The taper of the neck region 106 is specified by a taper angle β. Based on the tapered structure 100, the following items were examined:

(A) Growth of void during forward current stressing conditions and void shrinkage during reverse current stressing conditions;

(B) Effects of taper geometry (β)——vary length of tapered neck region 106, keeping same minimum and maximum widths; and (C) Time required to form a void and remove the void for selected void sizes (e.g., 0.125, 0.25, and 0.5 μm).

The following analytic modeling assumptions were used:

(A) Void growth emanates from the beginning (i.e., narrowest width region) of tapered neck region 106 (no incubation time);

(B) Metal (e.g., Cu) removed from void is deposited at the end of tapered neck region 106;

(c) Metal is redeposited in the void during reverse current;

(D) Void growth kinetics from data on uncapped structures, T=225° C.;

(E) Growth velocity has exponential dependence on temperature; and (F) Growth velocity has linear dependence on current density.

Figure 13:
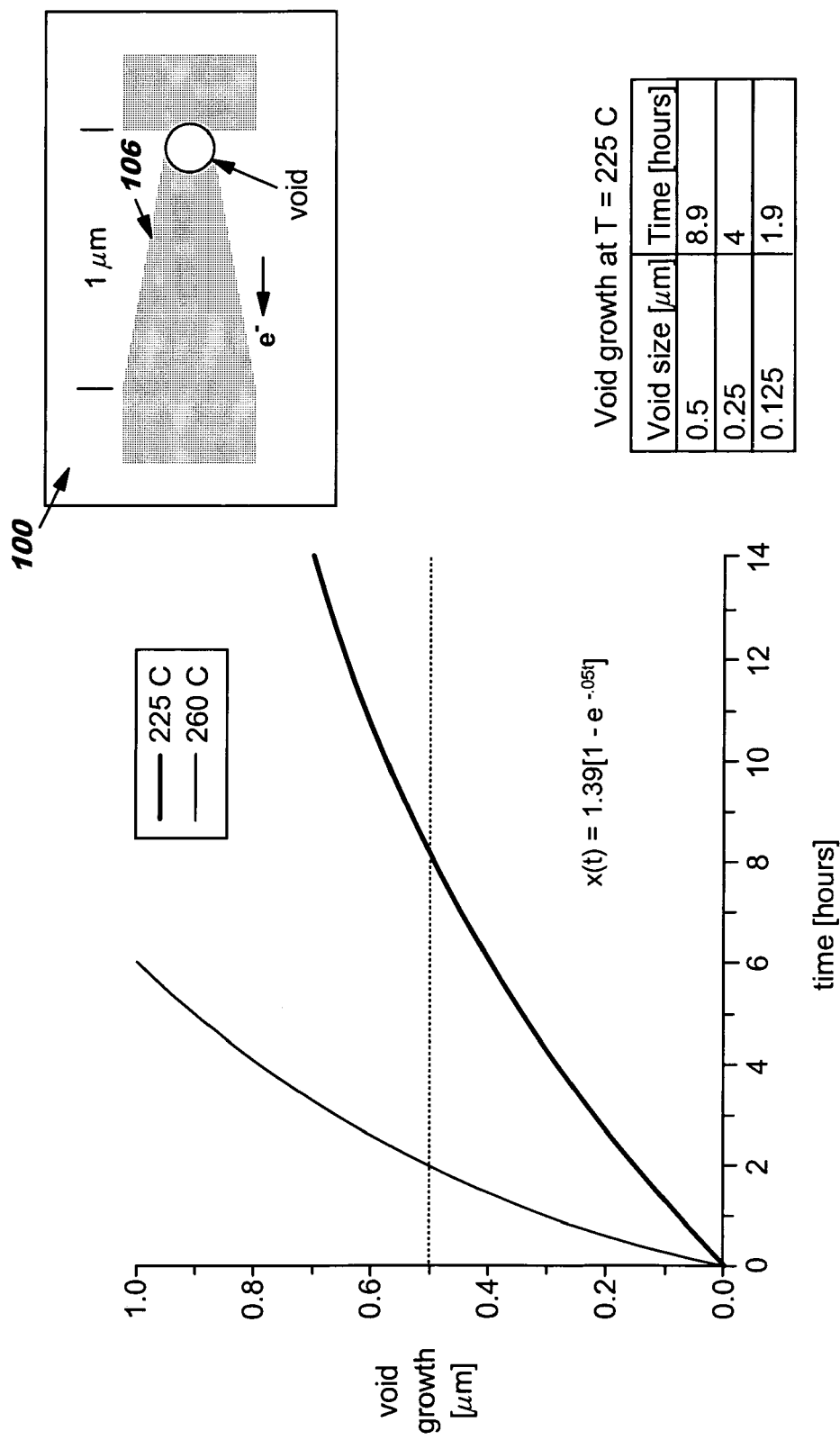
Figure 14:
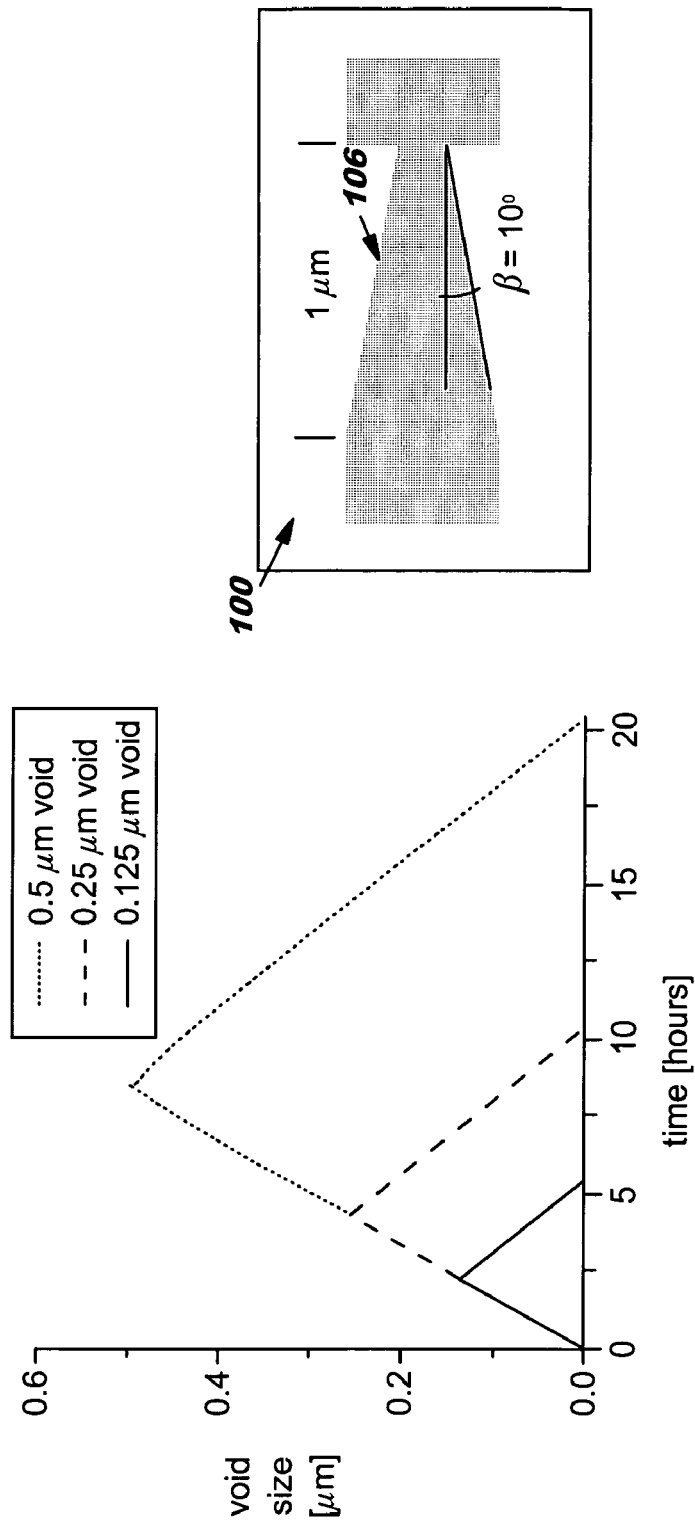
Figure 15:
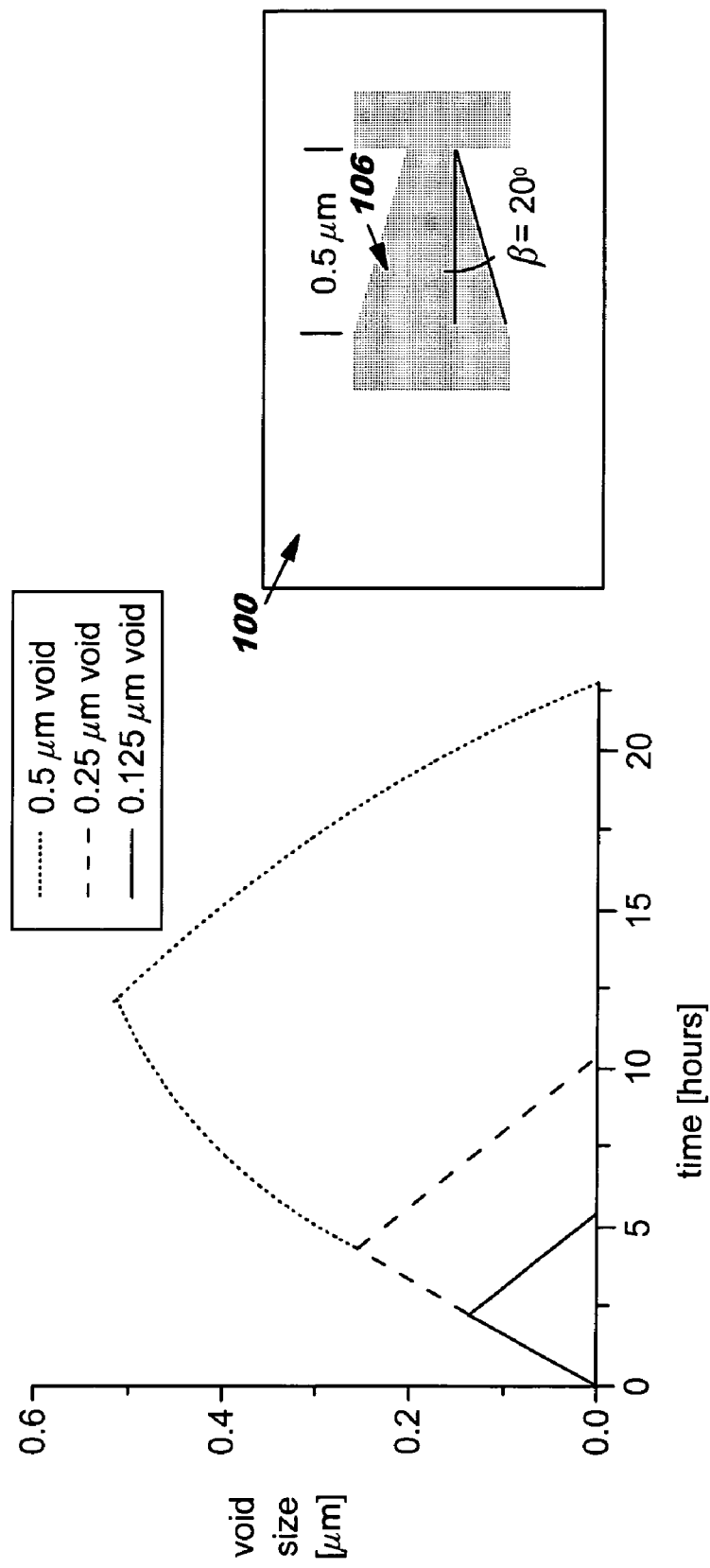
Figure 16:
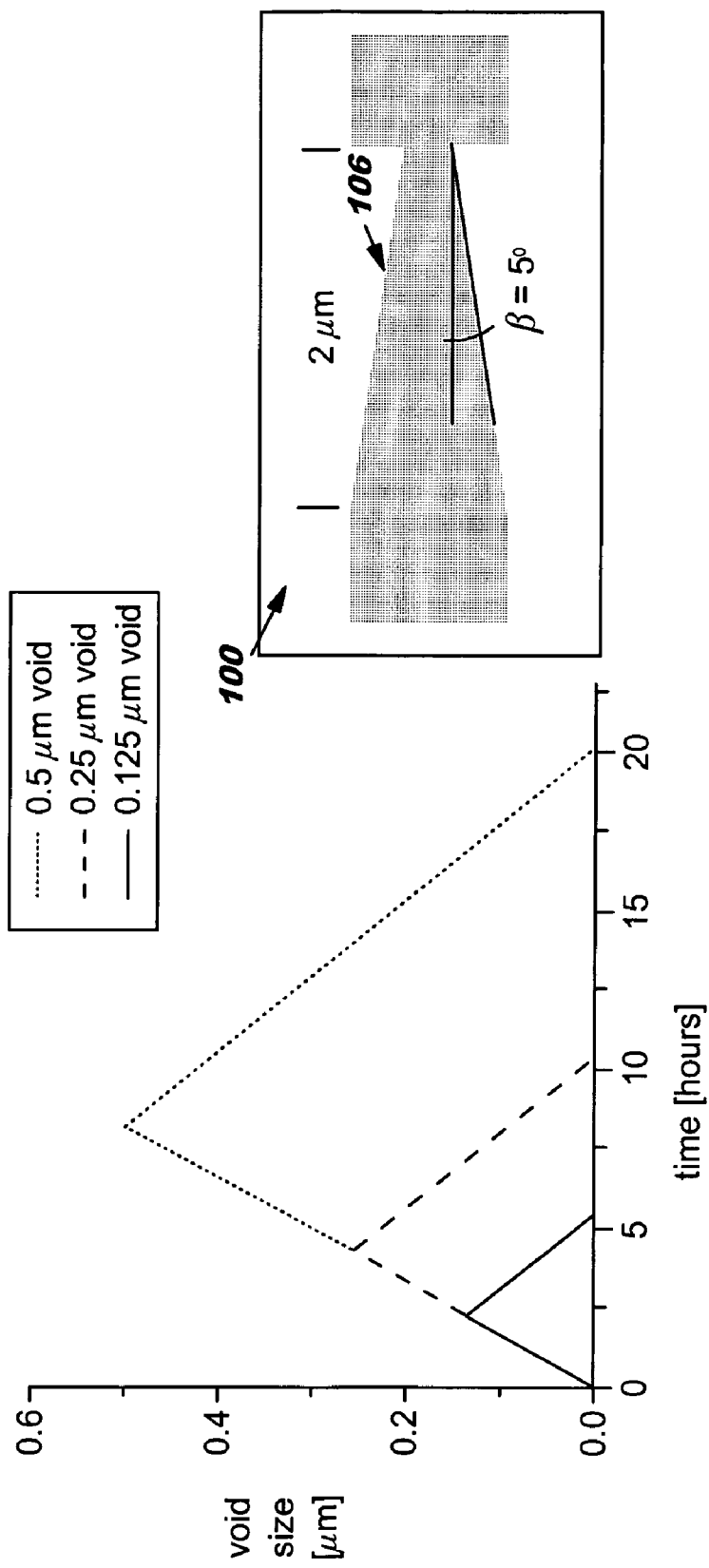

Based on these modeling assumptions, for a tapered neck region 106 with a length of 1.0 μm, the predicted void growth during forward current stressing ($J_o$=70 mA/μm$^2$ through 0.5 μm wide line) is illustrated in FIG. 13. The predicted void growth and shrinkage for a tapered neck region 1.0 μm long and with a taper angle β=10° is illustrated in FIG. 14. The predicted void growth and shrinkage for a tapered neck region 106 0.5 μm long and with a taper angle β=20° is illustrated in FIG. 15. The predicted void growth and shrinkage for a tapered neck region 2.0 μm long and with a taper angle β=5° is illustrated in FIG. 16.

From the above graphs, it can be seen that:

(A) Predicted electro-migration behavior in the tapered structure 100 follows asymmetric void growth and shrinkage during forward and reverse current.

(B) Taper Angle (β):

(1) Larger taper angle β increases time required to reach equivalent void size and increases nonlinearity of void growth rate.

(2) Total time for void growth and shrinkage is roughly equivalent.

(C) Time to reach equal void size is roughly proportional to current density (J).

(D) Strong dependence of temperature on void growth (activated process).

(Joule heating not accounted for in analytical model).

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method, comprising:
   programming an electrically blowable fuse using an electro-migration effect;
   reprogramming the electrically blowable fuse using a reverse electro-migration effect;
   providing a reference resistance using a portion of the electrically blowable fuse; and
   determining a state of the electrically blowable fuse by comparing a resistance of the electrically blowable fuse to the reference resistance.

2. The method of claim 1, wherein the resistance of the electrically blowable fuse is greater than the reference resistance after the programming, and wherein the resistance of the electrically blowable fuse is less than the reference resistance before the programming and after the reprogramming.

3. The method of claim 1, wherein a void is formed in a neck region of the electrically blowable fuse during the programming, and wherein the void is at least partially refilled during the reprogramming.

4. The method of claim 3, further comprising:
   adjusting programming conditions to control a size of the void formed in the neck region of the electrically blowable fuse during the programming.

5. The method of claim 4, wherein the programming conditions comprise at least one of temperature, voltage, and current.

6. The method of claim 3, wherein the neck region of the electrically blowable fuse is tapered.

7. The method of claim 6, further comprising:
   controlling a rate of void growth and shrinkage by adjusting a taper angle of the neck region of the electrically blowable fuse.

8. A fuse system, comprising:
   an electrically blowable fuse;
   means for programming the electrically blowable fuse using an electro-migration effect;
   means for reprogramming the electrically blowable fuse using a reverse electro-migration effect;
   a reference resistance provided by a portion of the electrically blowable fuse; and
   means for determining a state of the electrically blowable fuse by comparing a resistance of the electrically blowable fuse to the reference resistance.

9. The fuse system of claim 8, wherein the electrically blowable fuse includes a tapered neck region.

10. The fuse system of claim 9, wherein a void is formed in the tapered neck region of the electrically blowable fuse during the programming, and wherein the void is at least partially refilled during the reprogramming.

11. An integrated circuit comprising:
    an electrically blowable fuse;
    means for programming and reprogramming the electrically blowable fuse using an electro-migration effect and a reverse electro-migration effect, respectively;
    a reference resistance provided by a portion of the electrically blowable fuse; and
    means for determining a state of the electrically blowable fuse by comparing a resistance of the electrically blowable fuse to the reference resistance.

12. A method, comprising:
    programming an electrically blowable fuse having a tapered neck region using an electro-migration effect;

reprogramming the electrically blowable fuse using a reverse electro-migration effect;

wherein a void is formed in the tapered neck region of the electrically blowable fuse during the programming, and wherein the void is at least partially refilled during the reprogramming; and controlling a rate of growth and shrinkage of the void by adjusting a taper angle of the tapered neck region of the electrically blowable fuse.

13. The method of claim 12, further comprising:

providing a reference resistance; and determining a state of the electrically blowable fuse by comparing a resistance of the electrically blowable fuse to the reference resistance.

14. The method of claim 13, wherein the resistance of the electrically blowable fuse is greater than the reference resistance after the programming, and wherein the resistance of the electrically blowable fuse is less than the reference resistance before the programming and after the reprogramming.

15. The method of claim 13, further comprising:

providing the reference resistance using a portion of the electrically blowable fuse.

16. The method of claim 12, further comprising:

adjusting programming conditions to control a size of the void formed in the tapered neck region of the electrically blowable fuse during the programming.

17. The method of claim 16, wherein the programming conditions comprise at least one of temperature, voltage, and current.

* * * * *